(12) United States Patent
Lu et al.

(10) Patent No.: US 9,304,390 B2
(45) Date of Patent: Apr. 5, 2016

(54) EXTREME ULTRAVIOLET LITHOGRAPHY PROCESS AND MASK

(71) Applicant: Taiwan Semiconductor Manufacturing Company, Ltd., Hsin-Chu (TW)

(72) Inventors: Yen-Cheng Lu, New Taipei (TW); Shinn-Sheng Yu, Hsinchu (TW); Jeng-Horng Chen, Hsin-Chu (TW); Anthony Yen, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 201 days.

(21) Appl. No.: 14/209,163

(22) Filed: Mar. 13, 2014

(65) Prior Publication Data

US 2014/0268091 A1 Sep. 18, 2014

Related U.S. Application Data

(60) Provisional application No. 61/779,787, filed on Mar. 13, 2013.

(51) Int. Cl.
*G03F 1/22* (2012.01)
*G03F 7/20* (2006.01)

(52) U.S. Cl.
CPC .............. *G03F 1/22* (2013.01); *G03F 7/70091* (2013.01); *G03F 7/70125* (2013.01); *G03F 7/70283* (2013.01); *G03F 7/70308* (2013.01); *G03F 7/70325* (2013.01)

(58) Field of Classification Search
CPC ..................................... G03F 1/22; G03F 1/24
See application file for complete search history.

(56) References Cited

U.S. PATENT DOCUMENTS

| 4,947,413 | A | 8/1990 | Jewell et al. |
| 8,628,897 | B1 | 1/2014 | Lu et al. |
| 2013/0260288 | A1 | 10/2013 | Yu et al. |

OTHER PUBLICATIONS

Patrick Naulleau et al., "The SEMATECH Berkeley MET pushing EUV development beyond 22-nm half pitch," Center for X-Ray Optics, Lawrence Berkeley National Laboratory, Berkeley, CA, SPIE Advanced Lithography, San Jose, CA, Feb. 21-25, 2010, 10 pages.

*Primary Examiner* — Stephen Rosasco
(74) *Attorney, Agent, or Firm* — Haynes and Boone, LLP

(57) ABSTRACT

A system and process of an extreme ultraviolet lithography (EUVL) is disclosed. The system and process includes receiving a mask with two states, which have 180 degree phase difference to each other. These different states are assigned to adjacent main polygons and adjacent assist polygons of the mask. A nearly on-axis illumination (ONI) with partial coherence σ less than 0.3 is utilized to expose the mask to produce diffracted lights and non-diffracted lights. A majority portion of the non-diffracted lights and diffracted light with diffraction order higher than 1 are removed. Diffracted light having +1-st and −1-st diffracted order are collected and directed by a projection optics box (POB) to expose a target.

20 Claims, 7 Drawing Sheets

EXTREME ULTRAVIOLET LITHOGRAPHY PROCESS AND MASK

This patent claims the benefit of U.S. Ser. No. 61/779,787 filed Mar. 13, 2013, which is hereby incorporated by reference.

BACKGROUND

The semiconductor integrated circuit (IC) industry has experienced rapid growth in the past several decades. Technological advances in semiconductor materials and design have produced increasingly smaller and more complex circuits. These material and design advances have been made possible as the technologies related to processing and manufacturing have also undergone technical advances. As a size of the smallest component has decreased, numerous challenges have risen. For example, the need to perform higher resolution lithography processes grows. One lithography technique is extreme ultraviolet (EUV) lithography. Other techniques include X-Ray lithography, ion beam projection lithography, electron beam projection lithography, and multiple electron beam maskless lithography.

EUV lithography is a promising patterning technology for very small semiconductor technology nodes, such as 14-nm, and beyond. EUV lithography is very similar to optical lithography in that it needs a mask to print wafers, except that it employs light in the EUV region, e.g., at about 13.5 nm. At the wavelength of 13.5 nm, most materials are highly absorbing. Thus, reflective optics, rather than refractive optics, are commonly used in EUV lithography. Although existing methods of EUV lithography have been generally adequate for their intended purposes, they have not been entirely satisfactory in all respects. For example, challenges rise to improve the EUV lithography throughput, and uniformity of critical dimension. It is desired to have improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
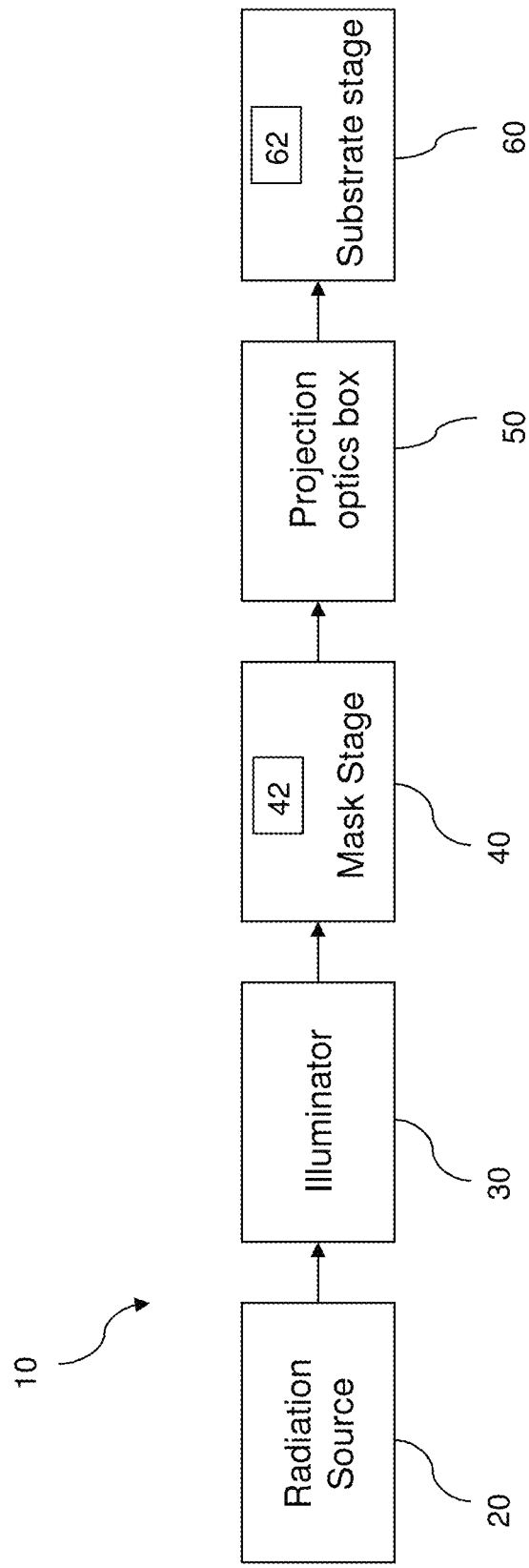
FIG. 1 is a block diagram of a lithography process for implementing one or more embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Referring to FIG. 1, an EUV lithography system 10 that may benefit from one or more embodiments of the present invention is disclosed. The lithography system 10 is also illustrated, in portion, in a schematic view. In the present embodiment, the lithography system 10 is an extreme ultraviolet (EUV) lithography system designed to expose a resist layer by EUV. The resist layer is sensitive to the EUV radiation. The EUV lithography system 10 employs a radiation source 20 to generate EUV light, such as EUV light having a wavelength ranging between about 1 nm and about 100 nm. In one particular example, the EUV radiation source 20 generates a EUV light with a wavelength centered at about 13.5 nm. The EUV lithography system 10 also employs an illuminator 30. The illuminator 30 may comprise refractive optics, such as a single lens or a lens system having multiple lenses (zone plates) and/or reflective optics, such as a single mirror or a mirror system having multiple mirrors in order to direct light from the radiation source 20 onto a mask 42. In the EUV wavelength range, reflective optics is employed generally. Refractive optics, however, can also be realized by zone-plates. In the present embodiment, the illuminator 30 is set up to provide an on-axis illumination (ONI) to illuminate a mask 42. In ONI, all incoming light rays incident on the mask are at the same angle of incidence (AOI), e.g., AOI=6°, as that of a chief ray. In many situations, there may be some angular spread of the incident light. For example, the EUV lithography system 10 may utilize disk illumination (i.e., illumination on a pupil plane is shaped like a disk centered at the pupil center). Partial coherence σ can also be used to describe a point source which produces a plane wave for illuminating the mask 42 In the present embodiment, it is sufficient to employ a nearly ONI having point sources with σ less than 0.3. In another embodiment, a stage prior to the illuminator 20 may additionally include other switchable mirrors that are controllable to direct the EUV light to different illumination positions with the mirrors of the illuminator 20. Accordingly, the lithography system 10 is able to achieve different illumination modes without sacrificing the illumination energy.

The EUV lithography system 10 also includes a mask stage 40 configured to secure a photomask 42 (in the present disclosure, the terms of mask, photomask, and reticle are used to refer to the same item). The mask 42 may be a transmissive mask or a reflective mask. In the present embodiment, the mask 42 is a reflective mask and has main polygons and a field of assist polygons. The main polygons represent items such as circuit patterns, and the assist polygons represent other items. The mask 42 may incorporate other resolution enhancement techniques such as phase-shifting mask (PSM) and/or optical proximity correction (OPC). The mask 42 will be described in further detail later.

Figure 2:
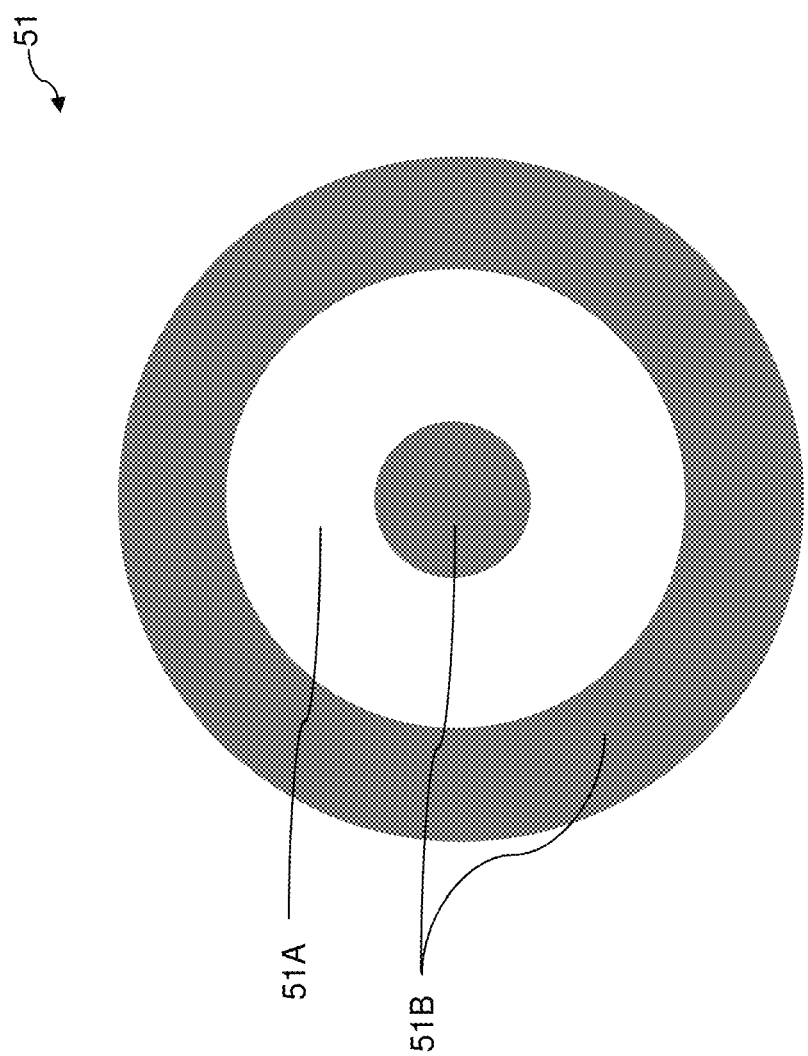
FIG. 2 is a diagrammatic top view of a pupil filter employed in the lithography process for implementing one or more embodiments of the present disclosure.

The EUV lithography system 10 also employs a projection optics box (POB) 50 for imaging the pattern of the mask 42 on to a target 62 (such as a semiconductor wafer) secured on a substrate stage 62 of the lithography system 30. The POB 50 may have refractive optics or reflective optics. The radiation reflected from the mask 42 (e.g., a patterned radiation) is collected by the POB 50. The POB 50 also includes a pupil filter 51 placed at optics pupil plane to control the light intensity distribution reflected from the mask 42. The pupil filter 51 has a plurality of light-transmitting regions 51A to transmit light reflected from the mask 42 to a substrate, such as a wafer, and a plurality of opaque regions 51B to block light reflected from the mask 42 thereby from transmitting through. In the present embodiment, the pupil filter 51 may employ various of patterns, such as shown in FIG. 2, to block targeted light reflected from the mask 42, which will be described in further detail below.

The target 62 includes a semiconductor wafer with a photosensitive layer (e.g., photoresist or resist), which is sensitive to the EUV radiation. The target 60 may be held by a target substrate stage. The target substrate stage provides control of the target substrate position such that the image of the mask is scanned onto the target substrate in a repetitive fashion (though other lithography methods are possible).

Figure 3:
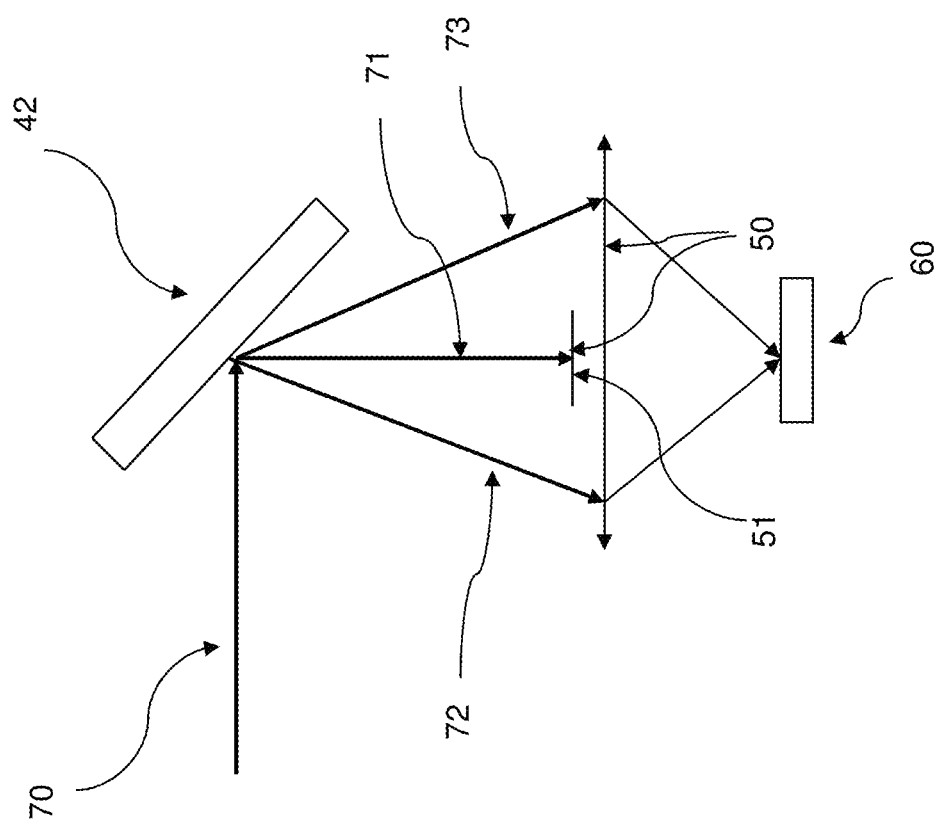
FIG. 3 is a diagrammatic perspective view of a projection optics box (POB) employed in the lithography process for implementing one or more embodiments of the present disclosure. Since a POB by reflective optics is difficult to sketch, the equivalent refractive optics is used to illustrate the underlying principle.

Referring to FIG. 3, an incident light ray 70, after being reflected from the mask 42, is diffracted into various diffraction orders due to the presence of mask patterns, such as a 0-th diffraction order ray 71, a −1-st diffraction order ray 72 and a +1-st diffraction order ray 73 and other higher diffraction order rays (not shown in the figure). In the present embodiment, non-diffracted light rays 71 and diffraction rays having order higher than $1^{th}$ are mostly removed by the pupil filter 51 with appropriate patterns in the POB 50.

The following description refers to the mask 42 and a mask fabrication process. The mask fabrication process usually includes two steps: a blank mask fabrication process and a mask patterning process. During the blank mask fabrication process, a blank mask is formed by depositing suitable layers (e.g., multiple reflective layers) on a suitable substrate. The blank mask is patterned during the mask patterning process to have a design of a layer of an integrated circuit (IC) device (or chip). The patterned mask is then used to transfer circuit patterns (e.g., the design of a layer of an IC device) onto a semiconductor wafer. The patterns can be transferred over and over onto multiple wafers through various lithography processes. Several masks (for example, a set of 15 to 30 masks) may be used to construct a complete IC device.

Figure 4:
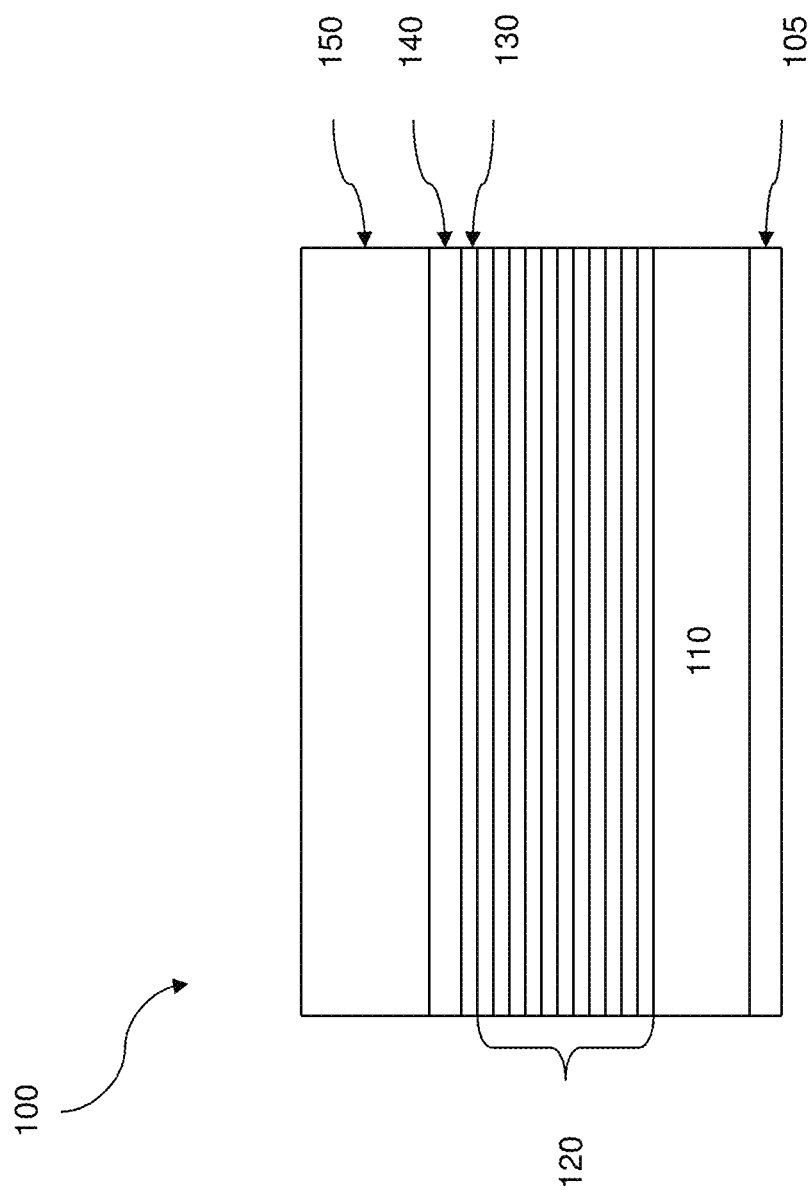
FIG. 4 is a diagrammatic cross-sectional view of various aspects of one embodiment of a blank mask at various stages of a lithography process constructed according to aspects of the present disclosure.

Referring to FIG. 4, a blank EUV mask 100 comprises a substrate 110 made of low thermal expansion material (LTEM). The LTEM material includes $TiO_2$ doped $SiO_2$, and/or other low thermal expansion materials known in the art. The LTEM substrate 110 serves to minimize image distortion due to mask heating. In the present embodiment, the LTEM substrate includes materials with a low defect level and a smooth surface. In addition, a conductive layer 105 may be deposited under (as shown in the figure) the LTEM substrate 110 for the electrostatic chucking purpose. In an embodiment, the conductive layer 105 includes chromium nitride (CrN), though other compositions are possible.

The blank EUV mask 100 includes a reflective multilayer (ML) 120 deposed over the LTEM substrate 110. According to Fresnel equations, light reflection will occur when light propagates across the interface between two materials of different refractive indices. The reflected light is larger when the difference of refractive indices is larger. To increase the reflected light, one may also increase the number of interfaces by deposing a multilayer of alternating materials and let light reflected from different interfaces interfere constructively by choosing appropriate thickness for each layer inside the multilayer. However, the absorption of the employed materials for the multilayer limits the highest reflectivity that can be achieved. The reflective ML 120 includes a plurality of film pairs, such as molybdenum-silicon (Mo/Si) film pairs (e.g., a layer of molybdenum above or below a layer of silicon in each film pair). Alternatively, the reflective ML 120 may include molybdenum-beryllium (Mo/Be) film pairs, or any material that is highly reflective at EUV wavelengths can be utilized for the reflective ML 120. The thickness of each layer of the reflective ML 120 depends on the EUV wavelength and the incident angle. The thickness of the reflective ML 120 is adjusted to achieve a maximum constructive interference of the EUV light reflected at each interface and a minimum absorption of the EUV light by the reflective ML 120. The reflective ML 120 may be selected such that it provides a high reflectivity to a selected radiation type/wavelength. A typical number of film pairs is 20-80, however any number of film pairs is possible. The reflective ML 120 usually achieves a reflectance of 0.65 or above. In an embodiment, the reflective ML 120 includes forty pairs of layers of Mo/Si. Each Mo/Si film pair has a thickness of about 7 nm, with a total thickness of 280 nm. In this case, a reflectivity of about 70% is achieved.

The blank EUV mask 100 also includes a capping layer 130 disposed above the reflective ML 120 to prevent oxidation of the reflective ML. In one embodiment, the capping layer 130 includes silicon with about 4-7 nm thickness.

The blank EUV mask 100 also includes a buffer layer 140 disposed above the capping layer 130 to act as an etching stop layer in a patterning or repairing process of an absorption layer, which will be described later. The buffer layer 140 has different etching characteristics from the absorption layer. The buffer layer 140 includes ruthenium (Ru), Ru compounds such as RuB, RuSi, chromium (Cr), Cr oxide, and Cr nitride. A low temperature deposition process is often chosen for the buffer layer to prevent inter-diffusion of the reflective ML 120. In the present embodiment, the buffer layer 140 includes ruthenium with about 2-5 nm thickness. In one embodiment, the capping layer and the buffer layer is a single layer.

In the present embodiment, the blank EUV mask 100 includes a phase-shifting layer 150 disposed above the buffer layer 140. The phase-shifting layer 150 includes materials, collaborating with thickness, to achieve an about 180 degree phase change of the reflection light. In one embodiment, the phase-shifting layer 150 includes molybdenum (Mo) having a thickness in a range from 40 nm to 48 nm. The phase-shifting layer 150 may also be formed by multiple layers of different materials.

One or more of the layers 105, 120, 130, 140 and 150 may be formed by various methods, including physical vapor deposition (PVD) process such as evaporation and DC magnetron sputtering, a plating process such as electrode-less plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other methods known in the art.

Figure 5:
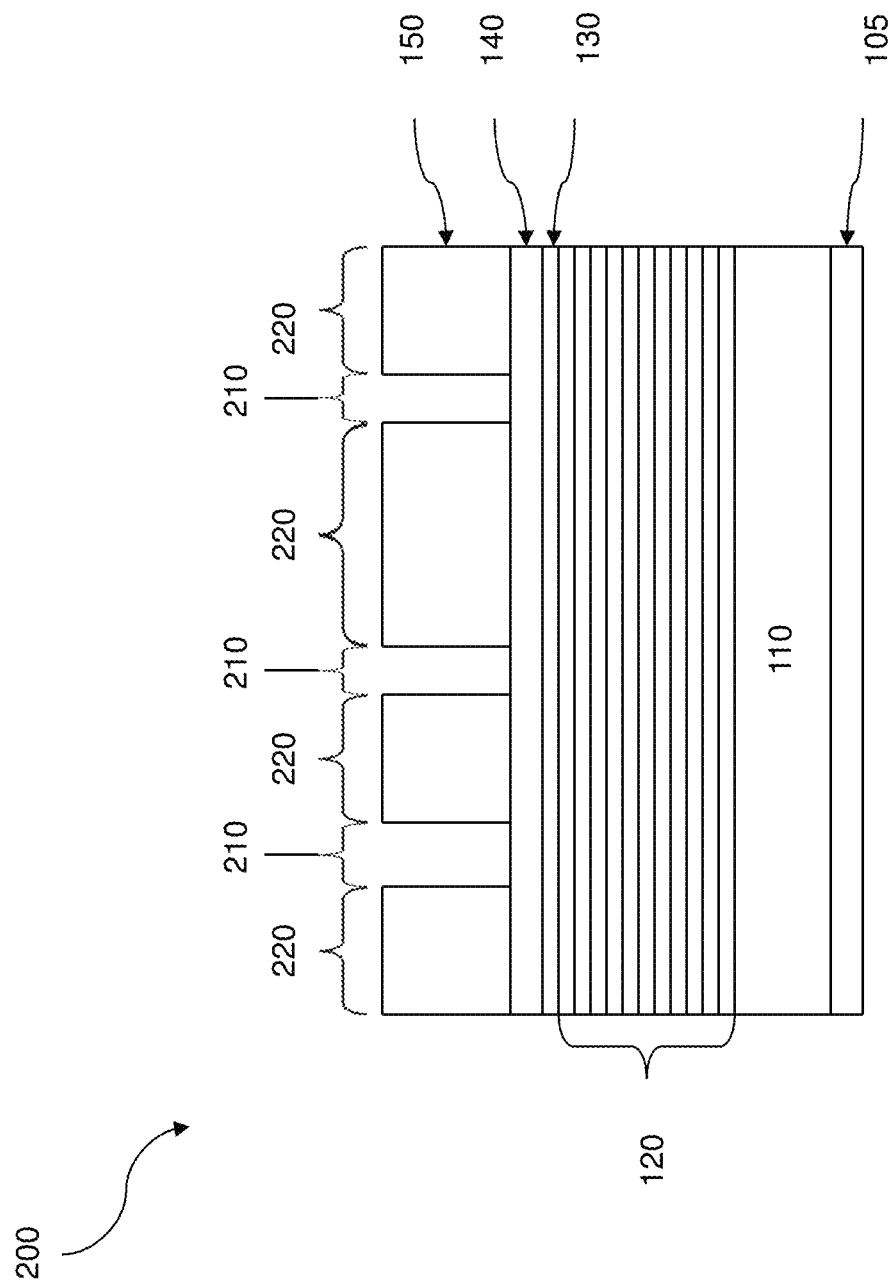
FIG. 5 is a diagrammatic cross-sectional view of various aspects of one embodiment of an EUV mask at various stages of a lithography process constructed according to aspects of the present disclosure.

Referring to FIG. 5, the phase-shifting layer 150 is patterned to form the design layout pattern EUV mask 200 having first and second states, 210 and 220. A portion of the phase-shifting layer 150 is removed to form the first state 210 while where the phase-shifting layer remains forms the second state 220. The patterned phase-shifting layer 150 produces an about 180-degree phase shift (for the reflected light from the first state 210) with respect to the reflected light from the second state 220. The phase-shifting layer 150 can be patterned by various patterning techniques. One such technique includes using a resist coating (e.g., spin-on coating), soft baking, mask aligning, exposure, post-exposure baking, developing the resist, rinsing, and drying (e.g., hard baking). An etching process is followed to remove portions of the phase-shifting layer 150 and form the first state 210. The etching process may include dry (plasma) etching, wet etching, and/or other etching methods. For example, the dry etching process may implement a fluorine-containing gas (e.g., CF4, SF6, CH2F2, CHF3, and/or C2F6), chlorine-containing gas (e.g., Cl2, CHCl3, CCl4, and/or BCl3), bromine-containing gas (e.g., HBr and/or CHBR3), iodine-containing gas, other suitable gases and/or plasmas, and/or combinations thereof. Alternative patterning processes include maskless photolithography, electron-beam writing, direct-writing, and/or ion-beam writing.

Figure 6:
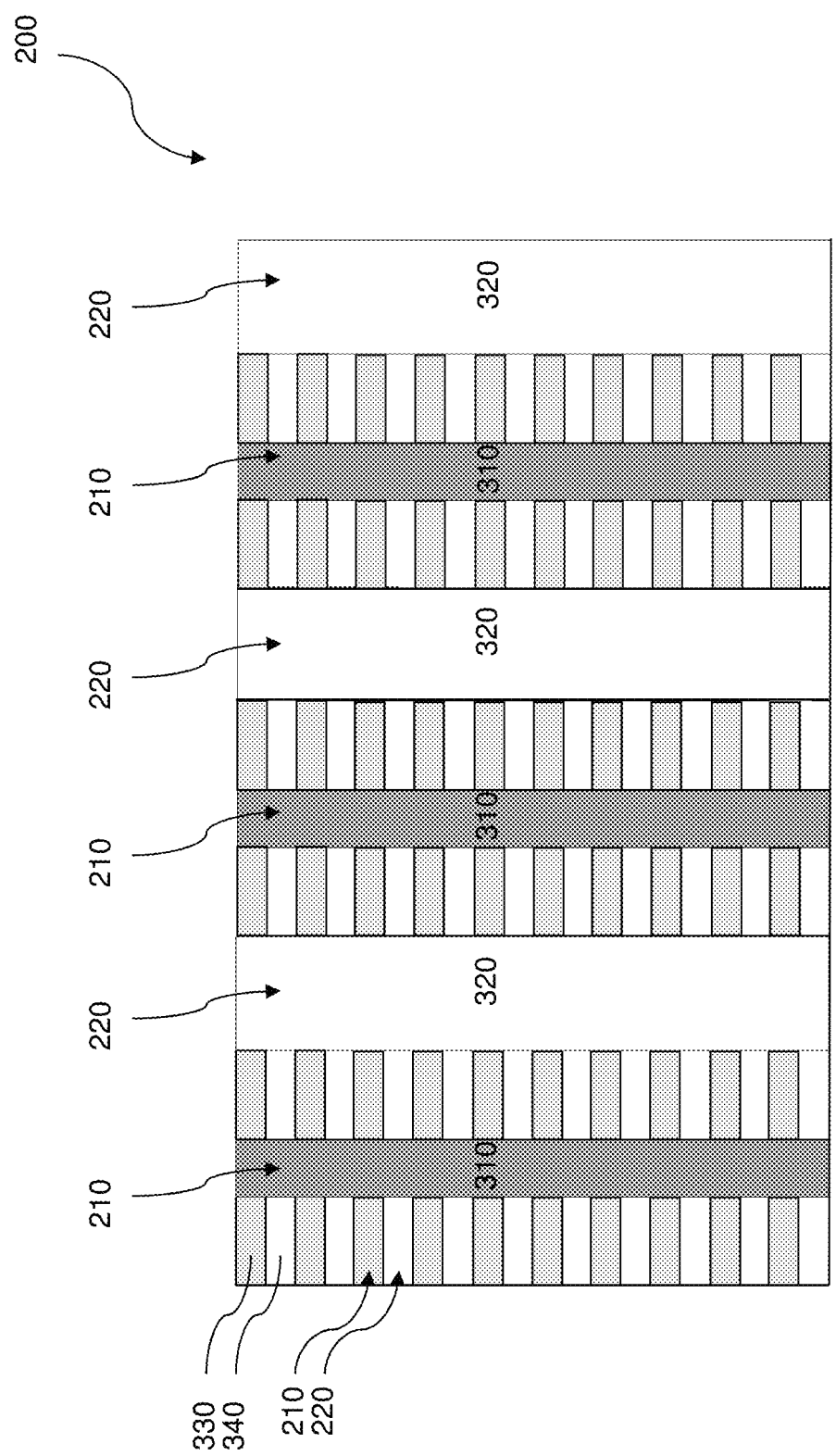
FIG. 6 is a diagrammatic perspective view of an EUV mask according to aspects of the present disclosure.

Referring to FIG. 6, in the present embodiment, states 210 and 220 of the EUV mask 200 are assigned to a first main polygon 310 and a second main polygon 320, which is adjacent to the first main polygon 310. Also states 210 and 220 are assigned to a first assist polygon 330 and a second assist polygon 340, which is adjacent to the first assist polygon 330. Main polygons, 310 and 320, and assist polygons, 330 and 340, may touch or overlap each other. Assigning different states of the EUV mask 200 to adjacent polygons and assist polygons will reduce the spatial frequency of mask patterns and improve the aerial image contrast and process window.

Figure 7:
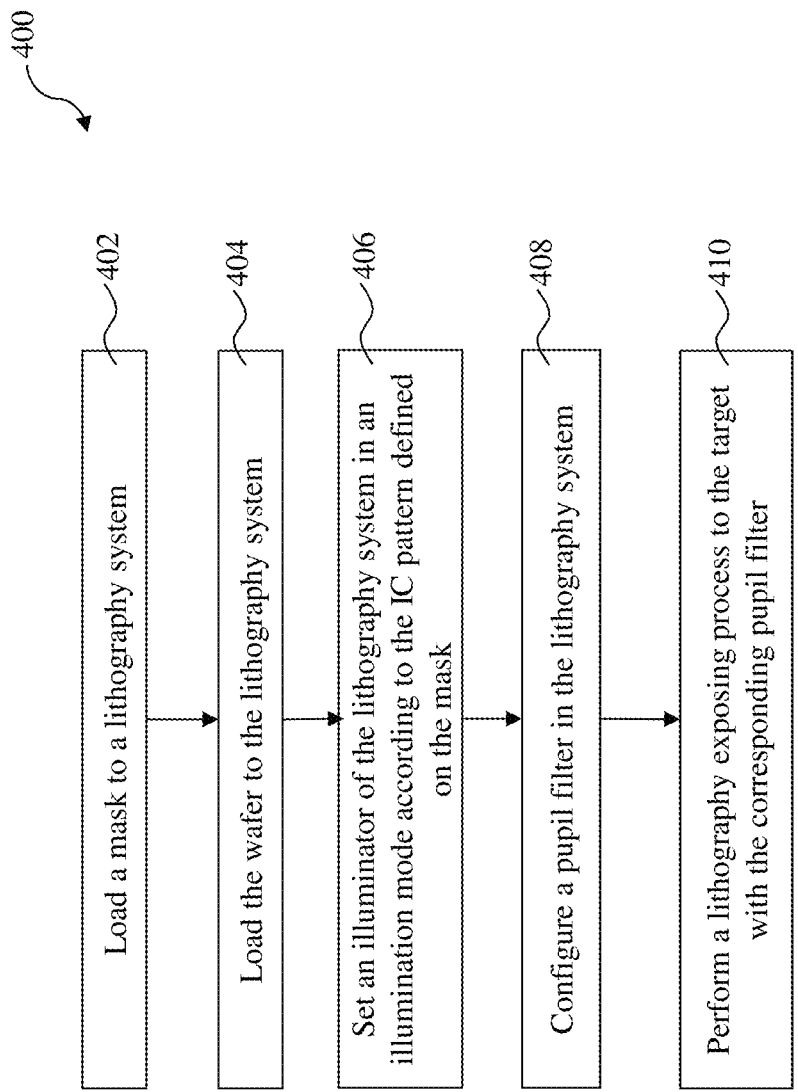
FIG. 7 is a flowchart of a lithography process constructed in accordance with some embodiments.

FIG. 7 is a flowchart of a method 400 of performing a lithography process in an integrated circuit fabrication constructed according to aspects of the present disclosure in various embodiments.

Referring to FIG. 7, the method 400 includes an operation 402 by loading to a lithography system 10 with the mask 42. In present embodiment, the mask 42 is the EUV mask 200, which has states 210 and 220 be assigned to a first main polygon 310 and a second main polygon 320, which is adjacent to the first main polygon 310. Also states 210 and 220 are assigned to a first assist polygon 330 and a second assist polygon 340, which is adjacent to the first assist polygon 330. Main polygons, 310 and 320, and assist polygons, 330 and 340, may touch or overlap each other.

The operation 402 in the method 400 may further include other steps, such as alignment after the mask 42 is secured on the mask stage 40.

Referring to FIG. 7, the method 400 also includes an operation 404 to load a target 62 to the substrate stage 60 of the lithography system 10. In the present embodiment, the target 62 is a semiconductor substrate, such as a silicon wafer. The target 62 is coated with a resist layer that is sensitive to the EUV light. The resist layer is to be patterned by a lithography exposure process such that the IC design layout (IC pattern) of the mask 42 is transferred to the resist layer.

Referring to FIG. 7, the method 400 also includes an operation 406 by setting the illuminator 30 of the lithography system 10 in a highly coherent illumination mode. In the present embodiment, an on-axis illumination (ONI) mode is achieved. The ONI mode may be achieved by a mechanism, like an aperture with a certain pattern, such as dipole, quasar, or disk, constructed according to various examples. The aperture is configured at the illuminator stage to achieve the ONI illumination mode. The incident light ray 70 from the illuminator 30, after being reflected from the mask 42, is diffracted into various diffraction orders due to presence of these mask patterns, such as a 0-th diffraction order ray 71, a +1-st diffraction order ray 72 and a −1-st diffraction order ray 73 (as shown in FIG. 3).

Referring to FIG. 7, the method of 400 also includes an operation 408 by configuring the pupil filter 51 in the lithography system 10. The pupil filter 51 is configured in a pupil plane of the lithography system 10. In an image optical system, there is a plane with field distribution corresponding to Fourier Transform of object (the mask 42 in the present case). This plane is called pupil plane. The pupil filter is placed in the pupil plane to filter out specific spatial frequency components of the EUV light from the mask 42. A pattern defined in the pupil filter 51 is determined by the respective illumination mode. FIG. 2 illuminates examples of the pattern of the pupil filter 51. In the present embodiment, the pupil filter 51 removes a majority of the non-diffracted lights and transmits most of +1-st diffraction order ray 72 and a −1-st diffraction order ray 73 to be collected by the POB 50 and be directed to expose the target 62. In one embodiment, more than 70% of non-diffraction light is removed.

Referring to FIG. 7, the method 400 proceeds to operation 410 by performing a lithography exposure process to the target 62 in the configured illumination mode and the pupil filter 51. The EUV light from the radiation source 20 is modulated by the illuminator 30 with the EUV energy distribution for the on-axis illumination, directed from the mask 42, and further filtered by the pupil filter 51, the EUV light images the IC pattern of the mask 42 to the target 62.

Additional steps can be provided before, during, and after the method 400, and some of the steps described can be replaced, eliminated, or moved around for additional embodiments of the method 400.

Based on the above, the present disclosure offers the EUV lithography system and process employing a nearly ONI, e.g., a disk illumination with partial coherence σ smaller than 0.3 to expose an EUV mask to produce diffracted light and non-diffracted light. The EUV lithography system and process employs a pupil filter to removes more than 70% of the non-diffracted light and diffraction light having diffraction order higher than 1, so as to obtain the benefit of throughput enhancement. The EUV lithography system and process also employs an EUV mask with two states having a 180 degree phase difference, achieved by forming a patterned phase-shifting layer above the reflective ML. These different states are assigned to adjacent main polygons and adjacent assist polygons. The EUV lithography system and process demonstrates an enhancement of aerial image contrast and throughput improvement.

The present disclosure is directed towards lithography systems and processes. In one embodiment, an extreme ultraviolet lithography (EUVL) process includes receiving a mask with two states having 180 degree phase difference to each other. The system and process also includes assigning different states to adjacent main polygons and adjacent assist polygons in a field (a region without polygons) of the mask. The system and process also includes exposing the mask by a nearly on-axis illumination (ONI) with partial coherence σ less than 0.3 to produce diffracted lights and non-diffracted lights, removing a majority portion of the non-diffracted lights and diffracted light with diffraction order higher than 1 and collecting and directing diffracted light with +1-st and −1-st diffracted order by a projection optics box (POB) to expose a target.

In another embodiment, an EUVL process includes receiving a mask with two states. These different states of the mask are assigned to adjacent polygons and adjacent assist polygons. The mask includes a low thermal expansion material (LTEM) substrate, a reflective multilayer (ML) above one surface of the LTEM substrate, a first state having a phase-shifting layer deposited above the reflective ML to provide a phase shift of about 180 degrees and a second state having no phase-shifting layer above the reflective ML. The system and process also includes exposing the mask by a nearly on-axis illumination (ONI) with partial coherence σ less than 0.3 to produce diffracted light and non-diffracted light, removing a majority portion of the non-diffracted light and diffracted light with diffraction order higher than 1 and collecting and directing diffracted light with +1-st and −1-st diffracted order by a projection optics box (POB) to expose a target.

The present disclosure is also directed towards masks. In one embodiment, the mask for extreme ultraviolet lithography (EUVL) includes a low thermal expansion material (LTEM) substrate, a reflective multilayer (ML) above one surface of the LTEM substrate, a conductive layer above an opposite surface of the LTEM substrate and a patterned phase-shifting layer above the reflective ML to define a first state and a second state. A phase difference between the first state and second state is about 180 degrees. These different states are assigned to adjacent main polygons and adjacent assist polygons in a field.

The foregoing outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet (EUV) lithography process, comprising:
   receiving a mask with two states having 180 degree phase difference to each other;
   assigning these different states to adjacent main polygons and a field of adjacent assist polygons in the mask;
   exposing the mask by a nearly on-axis illumination (ONI) with partial coherence σ less than 0.3 to produce diffracted lights and non-diffracted lights;
   removing a majority of the non-diffracted lights and diffracted light with a diffraction order higher than 1; and
   collecting and directing +1-st and −1-st diffracted light by a projection optics box (POB) to expose a target.

2. The process of claim 1, wherein the mask comprises:
   a low thermal expansion material (LTEM) substrate;
   a conductive layer above an opposite surface of the LTEM substrate;
   a reflective multilayer (ML) above one surface of the LTEM substrate;
   a capping layer above the reflective ML; and
   a buffer layer above the capping layer; and
   a patterned phase-shifting layer deposited above the capping layer.

3. The process of claim 2, wherein the phase-shifting layer includes molybdenum (Mo) having a thickness in a range from about 40 nm to 48 nm.

4. The process of claim 2, wherein the first state is sequentially configured as the phase-shifting layer, then the buffer layer, then the capping layer, then the reflective ML, and then the LTEM substrate.

5. The process of claim 2, wherein the second state is sequentially configured as the buffer layer, then the capping layer, then the reflective ML, and then the LTEM substrate.

6. The process of claim 1, wherein the first and the second states are assigned to adjacent main polygons.

7. The process of claim 1, wherein the first and the second states are assigned to adjacent assist polygons in the field.

8. The process of claim 1, wherein the majority portion of the non-diffracted light and diffracted light with diffraction orders higher than 1 are removed by a pupil filter.

9. The process of claim 1, wherein more than 70% of the non-diffracted light are removed.

10. An extreme ultraviolet (EUV) lithography process, comprising:
    receiving a mask with two states, wherein different states are assigned to adjacent polygons and adjacent assist polygons of the mask, the mask including:
      a low thermal expansion material (LTEM) substrate;
      a reflective multilayer (ML) above one surface of the LTEM substrate;
      a first state having a phase-shifting layer deposited above the reflective ML to provide a phase shift of about 180 degrees; and
      a second state having no phase-shifting layer above the reflective ML.
    exposing the mask by a nearly on-axis illumination (ONI) with partial coherence σ less than 0.3 to produce diffracted light and non-diffracted light;
    removing a majority of the non-diffracted light and diffracted light with diffraction order higher than 1; and
    collecting and directing +1-st and −1-st diffracted light by a projection optics box (POB) to expose a target.

11. The process of claim 10, wherein the phase-shifting layer includes molybdenum (Mo) having a thickness in a range from about 40 nm to 48 nm.

12. The process of claim 10, wherein the mask further comprises:
    a conductive layer above an opposite surface of the LTEM substrate;
    a capping layer above the reflective ML; and
    a buffer layer above the capping layer.

13. The process of claim 10, wherein the first state is sequentially configured as the phase-shifting layer, then the buffer layer, then the capping layer, then the reflective ML, and then the LTEM substrate.

14. The process of claim 10, wherein the second state is sequentially configured as the buffer layer, then the capping layer, then the reflective ML, and then the LTEM substrate.

15. The process of claim 10, wherein the majority portion of the non-diffracted light and diffracted light with diffraction order higher than 1 are removed by a pupil filter.

16. The process of claim 10, wherein more than 70% of the non-diffracted light are removed.

17. A mask for extreme ultraviolet lithography (EUVL), comprising:
- a low thermal expansion material (LTEM) substrate;
- a reflective multilayer (ML) above one surface of the LTEM substrate;
- a conductive layer above an opposite surface of the LTEM substrate; and
- a patterned phase-shifting layer above the reflective ML to define a first state and a second state, the phase difference of the first state and the second state is about 180 degrees, wherein, different said states are assigned to adjacent main polygons and adjacent assist polygons in a field.

18. The mask of claim 17, wherein the phase-shifting layer includes molybdenum (Mo) having a thickness in a range from about 40 nm to 48 nm.

19. The process of claim 17, wherein the first state is sequentially configured as the phase-shifting layer, then the buffer layer, then the capping layer, then the reflective ML, and then the LTEM substrate.

20. The process of claim 17, wherein the second state is sequentially configured as the buffer layer, then the capping layer, then the reflective ML, and then the LTEM substrate.

* * * * *